United States Patent [19]

Adams et al.

[11] 4,323,638

[45] Apr. 6, 1982

[54] REDUCING CHARGING EFFECTS IN CHARGED-PARTICLE-BEAM LITHOGRAPHY

[75] Inventors: Arthur C. Adams, Berkeley Heights; Frank B. Alexander, Jr., Totowa; Hyman J. Levinstein, Berkeley Heights; Louis R. Thibault, Piscataway, all of N.J.

[73] Assignee: Bell Telephone Laboratories, Incorporated, Murray Hill, N.J.

[21] Appl. No.: 178,988

[22] Filed: Aug. 18, 1980

[51] Int. Cl.³ .............................................. B05D 3/06
[52] U.S. Cl. ..................................... 430/275; 427/39; 427/43.1; 430/296; 430/942
[58] Field of Search ..................... 427/43.1, 38, 39; 430/296, 271, 275, 942

[56] References Cited

U.S. PATENT DOCUMENTS 3,689,768  9/1972  Sato et al. ......................... 430/942
3,949,131  4/1976  Fraser ............................... 428/201
4,224,733  9/1980  Spadea ............................... 29/571

FOREIGN PATENT DOCUMENTS 54-116883  9/1979  Japan ................................. 430/296

OTHER PUBLICATIONS

"Bell System Tech. Jour.", vol. 58, No. 5, May–Jun. 1979, pp. 1027–1036.

Primary Examiner—John H. Newsome
Attorney, Agent, or Firm—Lucian C. Canepa

[57] ABSTRACT

In a charged-particle-beam lithographic system, charge accumulation on the workpiece during alignment or writing can cause significant pattern placement errors. A film (16) formed directly under the resist layer (56) to be patterned is utilized as a charge-conducting medium during lithography. The pattern delineated in the resist layer (56) is transferred into the film (16) and subsequently into an underlying layer (20). The film (16) is highly compatible with standard lithographic and etching processes used to fabricate LSI and VLSI circuits.

15 Claims, 5 Drawing Figures

REDUCING CHARGING EFFECTS IN CHARGED-PARTICLE-BEAM LITHOGRAPHY

BACKGROUND OF THE INVENTION

This invention relates to fine-line lithography and, more specifically, to a technique for improving the performance of a charged-particle-beam lithographic system designed to fabricate large-scale-integrated (LSI) or very-large-scale-integrated (VLSI) circuits.

It is known that electron- and ion-beam exposure systems constitute attractive lithographic tools for fabricating LSI and VLSI circuits. But charge deposited by an electron or ion beam onto a workpiece during alignment or writing operations in such a lithographic system tends to accumulate on the workpiece. In turn, this produces charged regions characterized by spatially variable and time-dependent electric fields. If large enough, these fields can spuriously deflect the beam incident on the workpiece and thereby cause registration and pattern placement errors in the fabrication process. Such errors can seriously degrade the performance of the lithographic system and in practice make the attainment of high-resolution circuits with such a system costly if not impossible.

Accordingly, continuing efforts have been made by workers in the LSI and VLSI circuit art directed at trying to alleviate the aforenoted charge accumulation problem in lithographic systems. It was recognized that such efforts, if successful, could significantly improve the capability of charged-particle-beam lithographic systems to accurately delineate high-resolution patterns in an integrated circuit fabrication sequence.

SUMMARY OF THE INVENTION

Hence, an object of the present invention is a technique for reducing charging effects in a charged-particle-beam lithographic system.

Briefly, this and other objects of the present invention are realized in a specific illustrative integrated circuit fabrication sequence in which a charge-conducting film is deposited on top of a workpiece-supported layer to be patterned. In turn, a charged-particle-sensitive resist layer is formed on top of the charge-conducting film. Illustratively, the charge-conducting film constitutes a plasma-deposited boron-doped polysilicon film. This film, which is highly compatible with standard lithographic and etching processes used to fabricate LSI and VLSI circuits, is utilized to bleed off charge that is generated by the writing beam during patterning of the resist layer.

In one particular embodiment of the invention, the layer to be patterned is formed on one main surface of a semiconductor wafer. The charge-conducting film is deposited on top of the layer to be patterned, on the sides of the wafer and on at least a peripheral portion of the other main surface of the wafer. A resist layer is then coated on top of the portion of the charge-conducting film that overlies the main surface of the wafer. In turn, the wafer is mounted in a cassette holder to establish an electrical connection between the peripheral portion of the charge-conducting film and a part of the holder that is connected to a point of reference potential. While the wafer is so mounted in the cassette holder, a pattern is delineated in the resist layer by directing a charged-particle beam thereat. Subsequently, the pattern delineated in the resist layer is transferred into the charge-conducting film and then into the layer to be patterned.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
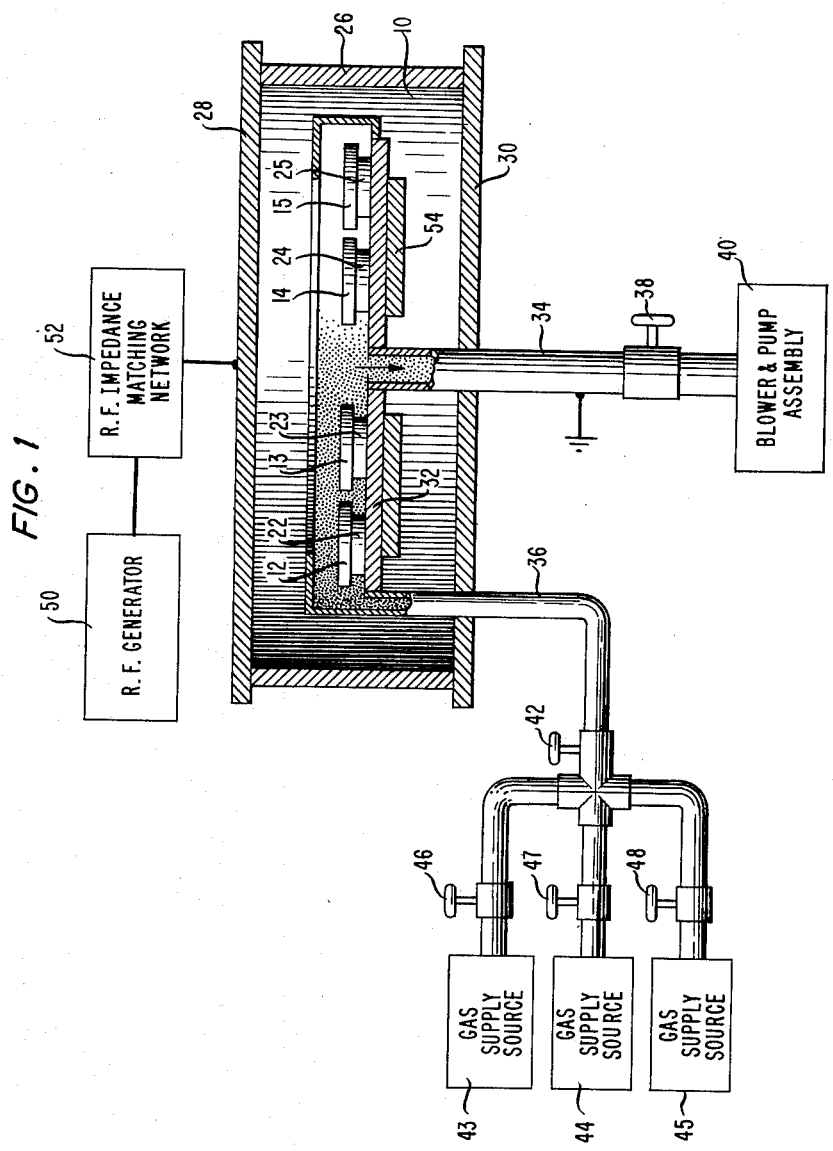
FIG. 1 is a schematic representation of a specific illustrative radial-flow reactor of the type suitable for forming a charge-conducting film on a wafer in accordance with the principles of the present invention.

A charge-conducting film made in accordance with the principles of the present invention is advantageously deposited on the surface of a workpiece in a conventional radial-flow plasma reactor. A simplified schematic representation of such a reactor is shown in FIG. 1. The reactor includes a reaction chamber 10. Plural workpieces 12-15 are shown mounted in the chamber 10.

Figure 2:
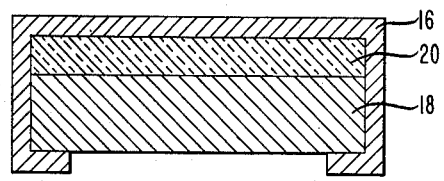
FIG. 2 is a cross-sectional depiction of a wafer coated with such a charge-conducting film.

In accordance with a specific illustrative feature of the present invention, a continuous charge-conducting film is designed to be formed on the entire top surface of each of the workpieces 12-15, on the sides of the workpieces and on a peripheral portion of the bottom surface of each of the workpieces. Such a film 16 is shown in FIG. 2 deposited on a workpiece that comprises, illustratively, a silicon wafer 18 having thereon a layer 20 to be patterned. By way of example, the layer 20 comprises a 1.5-micron-thick layer of photoresist.

As indicated in FIG. 1, the workpieces 12-15 to be coated are respectively centrally mounted on spacer elements 22-25 made, for example, of aluminum. Illustratively, each of the elements 22-25 comprises a disc about 0.02 inches thick and approximately two inches in diameter. The workpieces 12-15 are, for example, each about three inches in diameter. Thus, each workpiece overhangs its associated spacer element. In the particular illustrative example assumed herein, a half-inch-wide band on the lower surface of each overhanging workpiece is therefore accessible to have a charge-conducting film deposited thereon.

The reaction chamber 10 of FIG. 1 is bounded by a cylindrical insulating member 26, a conductive cathode member 28 and a bottom plate 30. The spacer elements 22-25 and the workpieces 12-15 are mounted on a conductive anode member 32. The member 32 is supported by ducts 34 and 36. The duct 34 extends via valve 38 to a standard blower and pump assembly 40. The duct 36 is connected to a mixing valve 42 to which a combination of gases is supplied, as specified below. The end of the duct 36 within the chamber 10 is shaped in the form of an annulus having an open side facing the workpieces 12-15 to be coated. In that way, a radial flow of gases over the workpieces is achieved. As a result, the film deposited on the workpieces in the chamber 10 is in practice highly uniform.

In one specific illustrative embodiment of the principles of the present invention, the charge-conducting coating deposited on each of the workpieces 12–15 advantageously comprises an amorphous boron-doped silicon film. Such a polysilicon film is formed, for example, by mixing gases respectively emanating from pressurized gas supply sources 43–45. By way of illustration, the gas supply source 43 furnishes three percent silane ($SiH_4$) in an argon (Ar) carrier gas, the source 44 furnishes one percent diborane ($B_2H_6$) in an argon carrier and the source 45 furnishes a pure argon diluent gas. The gases supplied by the sources 43–45 flow through valves 46–48, respectively, and are then mixed in the valve 42. Illustratively, after mixing, the gas flow into the chamber 10 is about 4.75 liters per minute and its composition is approximately 0.8 percent $SiH_4$, 0.2 percent $B_2H_6$ and 99.0 percent Ar.

A plasma discharge is established in the reaction chamber 10 of FIG. 1 by applying a radio-frequency (rf) potential between the cathode 28 and the anode 32. An rf generator 50 operating, for example, at 13.56 Megahertz is connected via a standard rf impedance matching network 52 to the cathode 28. The anode 32 is connected to a point of reference potential such as ground. This may be done, for example, by making the duct 34 out of a suitable metal and grounding the duct.

Illustratively, the pressure maintained within the reaction chamber 10 is about one Torr. The input power delivered to the chamber is approximately six watts. Advantageously, the anode temperature is maintained at about 200 degrees C. This is done, for example, by means of a standard heater unit 54. Under these specific conditions, a uniform film was deposited on the workpieces 12–15 at a rate of approximately 150 Angstrom units per minute. The deposition rate can be easily varied by selectively controlling the gas composition, the gas pressure, the gas flow or the input power.

In practice, a charge-conducting film of the type specified about having a thickness in the range 500-to-1000 Angstrom units has been found to be advantageous. Such a film conforms well to a variety of underlying surfaces and typically exhibits good step coverage thereof. Also, such a film can be patterned with high resolution in a dry etching step utilizing an overlying charged-particle-sensitive resist material as an etch-resistant mask therefor. Etching of the film can be carried out in a standard plasma comprising, for example, $CF_4$ and $O_2$, or $C_2F_6$ and $Cl_2$, or $C_2F_6$ and $CF_3Cl$, or $CF_3Cl$ or $CHF_3$. Further, the patterned film can itself be utilized as an etch-resistant mask for transferring the pattern therein into an underlying layer, as will be specified in more detail later hereinbelow.

In addition, a charge-conducting film of the type specified above exhibits a relatively low tensile stress (for example, less than about $2 \times 10^9$ dynes per square centimeter). Such a low-tensile-stress film is advantageous because it has very little tendency to peel and, moreover, it causes virtually no distortion of the workpiece on which it is coated.

At relatively low electric field strengths, the aforespecified film 16 behaves an an intrinsic semiconductor. But, at the relatively high electric field strengths typically encountered during charged-particle-beam lithography, the film becomes conductive and serves as an effective discharge path to prevent the accumulation of any substantial amount of charge on the workpiece.

Figure 3:
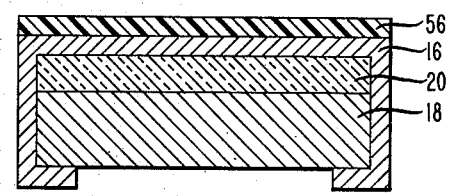
FIG. 3 shows the coated FIG. 2 wafer with a resist layer deposited thereon.

In FIG. 3, a resist layer 56 is shown coated on the top portion only of the aforespecified charge-conducting film 16. The layer 56 is made of any suitable negative or positive resist material adapted for use in a charged-particle-beam exposure system. A variety of such materials sensitive to electron and/or ion beams are known in the art. Typically, such materials bond themselves to the aforespecified film 16 in a highly adherent way. By selectively irradiating and then removing specified regions of such a material, a prescribed pattern is delineated therein. Thereafter, in a standard processing sequence, the pattern defined in the resist layer 56 is transferred into the underlying layer 20. Herein, in accordance with applicants' processing sequence, the pattern in the resist layer 56 is first transferred into the charge-conducting layer and, subsequently, into the underlying layer 20.

For illustrative purposes, it is noted in particular that the charge-conducting film specified herein is process compatible and especially well suited for use with electron-beam resists such as poly(glycidyl methacrylate-co-ethyl acrylate) also known as COP, poly(glycidyl methacrylate-co-chlorostyrene) also known as GMC and poly(olefin sulfone) also known as PBS.

In practice, the resist-coated wafer shown in FIG. 3 is typically mounted in a cassette unit. In turn, the cassette unit is loaded into a charged-particle-beam lithographic system for patterning of the resist layer 56. A conventional such cassette unit 60 is depicted in cross-section in FIG. 4. The resist-coated workpiece of FIG. 3 is shown mounted in the unit 60.

Figure 4:
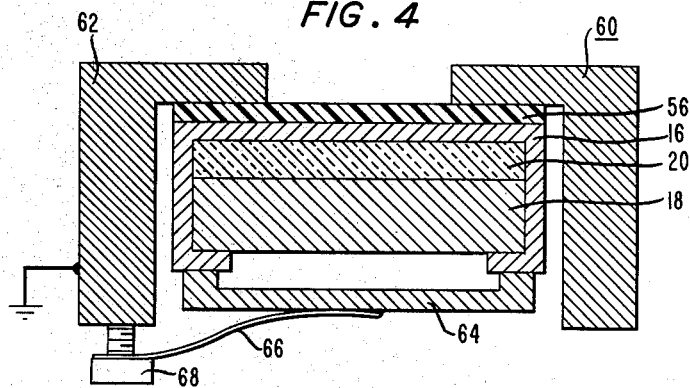
FIG. 4 shows the FIG. 3 structure mounted in a cassette holder.

The cassette unit 60 of FIG. 4 comprises an inverted-L-shaped frame member 62. The unit 60 also includes a back plate 64 made of a conductive material such as aluminum and a spring member 66 made of a conductive material such as beryllium-copper. One end of the spring member 66 is attached, for example by a screw 68, to the lower face of the frame member 62. When the cassette unit 60 is mounted in a lithographic system, the frame member 62 of the unit 60 is electrically connected to a point of reference potential such as ground.

To mount a resist-coated workpiece in the cassette unit 60 of FIG. 4, the screw 68 and its associated spring member 66 are detached from the frame member 62. The back plate 64 is thereby released and can be removed from the unit. With the frame member 62 inverted relative to the position depicted in FIG. 4, the workpiece (inverted relative to the orientation shown in FIG. 3) is then placed in the unit 60. Subsequently, the back plate 64 and its retaining spring 66 are assembled in the manner shown in FIG. 4. In that way, the top and bottom of the resist-coated workpiece are positioned in secure resilient engagement with the frame member 62 and the back plate 64, respectively. Typically, so as not to introduce undesirable stresses and cause possible warpage of the workpiece, the sides of the workpiece are designed not to contact the frame member 62. When the workpiece is positioned as indicated in FIG. 4, the conductive back plate 64 is maintained in good electrical contact with the aforedescribed peripheral bottomside portion of the charge-conducting film 16. As a result, charge deposited by an electron or ion beam during lithographic alignment or writing is conducted to ground by the film 16. Charge accumulation in or on the depicted workpiece is thereby substantially reduced. Accordingly, alignment or pattern placement errors arising from the effects of such charge accumulation are virtually eliminated.

The aforespecified charge-conducting film 16 makes unnecessary the heretofore common practice of removing insulating (for example, oxide) films from the bottom side of the wafer 18 prior to irradiating the resist layer thereof in a lithographic system. By being able to retain these insulating films in place, the processing sequence is simplified and, moreover, the likelihood of introducing stresses and causing wafer warpage during removal is eliminated.

It is significant that high-resolution images can be transferred into and from the aforespecified charge-conducting film using standard dry etching processes. This characteristic of the film makes it particularly attractive for inclusion in the steep-profile three-layer pattern generation technique described by J. M. Moran and D. Maydan in "High Resolution, Step Profile, Resist Patterns", in *The Bell System Technical Journal*, volume 58, No. 5 (May-June 1979), pages 1027–1036. This technique is also described in a commonly assigned copending U.S. application of D. B. Fraser, D. Maydan and J. M. Moran designated Ser. No. 941,369, filed Sept. 11, 1978, now U.S. Pat. No. 4,244,799.

Figure 5:
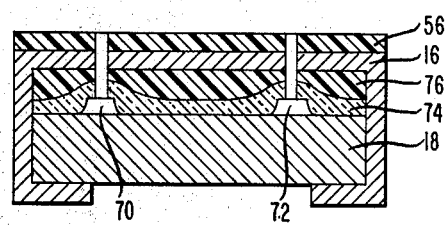
FIG. 5 is a cross-sectional depiction of a wafer which comprises a charge-conducting film made in accordance with this invention coated on top of a relatively thick layer of the type utilized in a so-called three-layer pattern generation process.

FIG. 5 illustrates the applicability of applicants' inventive principles to the above-specified three-layer pattern generation technique. In FIG. 5, the charge-conducting film 16, the wafer 18 and the resist layer 56 are designated with the same reference numerals utilized therefor in FIGS. 2–4. Also shown in FIG. 5 are conductive elements 70 and 72 and an insulating layer 74 having a nonplanar top surface. In accordance with a typical integrated circuit fabrication sequence, the layer 74 is to be patterned to form windows therein in alignment with the elements 70 and 72.

As specified in the aforecited article and copending application, a relatively thick sacrificial layer 76 is advantageously deposited on top of the layer 74. In one specific illustrative case, the layer 76 comprises a 2.6-micron-thick layer of HPR-204 photoresist manufactured by Hunt Chemical Company. The top surface of the relatively thick layer 76 is essentially planar. As heretofore practiced, a thin intermediate masking layer made, for example, of silicon dioxide is formed on top of the layer 76. In accordance with a feature of the present invention, the charge-conducting film 16 itself functions as the intermediate layer. After exposure and development of the overlying resist layer 56, the film 16 is dry etched (for example by $CHF_3$ reactive ion etching). The thick layer 76 is then dry etched by, for example, oxygen reactive ion etching, utilizing the film 16 as an etch mask therefor. Submicron resolution with essentially vertical walls in the thick layer 76 is thereby achieved. Subsequent standard processing steps are then carried out. Typically, these subsequent steps include removal from the depicted structure of the layer 76, the film 16 and the layer 56.

Thus, as illustrated in FIG. 5 and as described above, the film 16 can advantageously be included in an integrated circuit fabrication sequence both to minimize charge accumulation therein and, moreover, to serve as the intermediate masking layer in the aforeidentified three-layer pattern generation technique.

Finally, it is to be understood that the above-described techniques are only illustrative of the principles of the present invention. In accordance with these principles, numerous modifications and alternatives may be devised by those skilled in the art without departing from the spirit and scope of the invention.

We claim:

1. A method of fabricating integrated circuits by patterning a resist layer by means of a charged-particle beam in a high-resolution lithographic system, said method comprising the steps of forming on one main surface of a wafer a layer to be patterned, depositing a continuous charge-conducting film on top of said layer to be patterned, on the sides of said wafer and on at least a peripheral portion of the other main surface of said wafer, depositing a resist layer on top of the portion of said charge-conducting film that overlies the main surface of said wafer, mounting said wafer in a cassette holder to establish an electrical connection between the peripheral portion of said charge-conducting film and a part of said holder that is connected to a point of reference potential, and, while said wafer is so mounted in said cassette holder, delineating a pattern in said resist layer by directing a charged-particle beam at said resist layer.

2. A method as in claim 1 further including the steps of transferring the pattern delineated in said resist layer into said charge-conducting film, and transferring the pattern in said film into said layer to be patterned.

3. A method as in claim 2 wherein said layer to be patterned comprises a relatively thick sacrificial layer having a top surface that is essentially planar.

4. A method as in claim 3 wherein said charge-conducting film comprises a plasma-deposited boron-doped polysilicon film approximately 500-to-1000 Angstrom units thick.

5. A method of fabricating integrated circuits comprising the steps of forming on one main surface of a wafer a layer to be patterned, forming a plasma-deposited boron-doped polysilicon film exhibiting charge-conducting properties on top of said layer to be patterned, and depositing a resist layer on top of said charge-conducting film.

6. A method as in claim 5 wherein said charge-conducting film is also formed on the sides of said wafer and on a peripheral portion of the other main surface of said wafer.

7. A method as in claim 6 further including the steps of mounting said wafer in a holder in a charged-particle-beam lithographic system to establish an electrical connection between the peripheral portion of said charge-conducting film and a point of reference potential, and, while said wafer is so mounted, delineating a pattern in said resist layer by directing a charged-particle beam at said resist layer.

8. A method as in claim 7 further including the steps of transferring the pattern delineated in said resist layer into said charge-conducting film, and transferring the pattern in said film into said layer to be patterned.

9. A method of fabricating integrated circuits by patterning a resist layer (56) by means of a charged-particle beam in a high-resolution lithographic system, said method comprising the steps of forming on one main surface of a wafer (18) a layer (20) to be patterned, and delineating a pattern in said resist layer (56) by directing a charged-particle beam at said resist layer (56), characterized in that said method comprises the steps of depositing a charge-conducting film (16) on top of said layer (20) to be patterned, on the sides of said wafer (18) and on at least a peripheral portion of the other main surface of said wafer (18), said resist layer (56) being deposited on top of the portion of said charge-conducting film (16) that overlies the main surface of said wafer (18).

10. A method of fabricating integrated circuits comprising the steps of forming on one main surface of a wafer a layer to be patterned, forming a charge-conducting film on top of said layer to be patterned, depositing a resist layer on top of said charge-conducting film, delineating a pattern in said resist layer by directing a charged-particle beam at said resist layer, transferring the pattern delineated in said resist layer into said charge-conducting film, and, utilizing said patterned film as a mask, transferring the pattern in said film into said layer to be patterned.

11. A method as in claim 10 wherein said layer to be patterned comprises a relatively thick sacrificial layer having a top surface that is essentially planar.

12. A method as in claim 11 wherein said charge-conducting film comprises a doped polysilicon film.

13. A method as in claim 12 wherein said film comprises a plasma-deposited boron-doped polysilicon film approximately 500-to-1000 Angstrom units thick.

14. A method as in claim 10 wherein said charge-conducting film is also formed on the sides of said wafer and on a peripheral portion of the other main surface of said wafer.

15. A method as in claim 14 further including the steps of mounting said wafer in a holder in a charged-particle-beam lithographic system to establish an electrical connection between the peripheral portion of said charge-conducting film and a point of reference potential, while said wafer is so mounted, delineating a pattern in said resist layer by directing a charged-particle beam at said resist layer, transferring the pattern delineated in said resist layer into said charge-conducting film, and, utilizing said patterned film as a mask, transferring the pattern in said film into said layer to be patterned.

* * * * *